United States Patent [19]

Ueno

[11] Patent Number: 4,888,716
[45] Date of Patent: Dec. 19, 1989

[54] LIFE DIAGNOSIS APPARATUS FOR AUTOMOTIVE BATTERY

[75] Inventor: Sadayasu Ueno, Katsuta, Japan

[73] Assignee: Hitachi, Ltd., Tokyo, Japan

[21] Appl. No.: 37,852

[22] Filed: Apr. 13, 1987

[30] Foreign Application Priority Data

Apr. 14, 1986 [JP] Japan .................................. 61-84138

[51] Int. Cl.⁴ ........................................... G01N 27/42
[52] U.S. Cl. ..................................... 364/550; 364/481;
340/636; 324/429; 324/430
[58] Field of Search ....................... 364/550, 481, 483;
324/425, 426, 427, 428–435, 380, 500; 340/636

[56] References Cited

U.S. PATENT DOCUMENTS

| | | | |
|---|---|---|---|
| 4,290,109 | 9/1981 | Taniguchi et al. | 364/481 |
| 4,322,685 | 3/1982 | Frailing et al. | 324/429 |
| 4,333,149 | 6/1982 | Taylor et al. | 364/481 |
| 4,361,809 | 11/1982 | Bil et al. | 324/429 X |
| 4,377,787 | 3/1983 | Kikuoka et al. | 324/427 X |
| 4,423,378 | 12/1983 | Marino et al. | 324/429 X |
| 4,423,379 | 12/1983 | Jacobs et al. | 324/429 |
| 4,453,129 | 6/1984 | Lissalde et al. | 324/429 |
| 4,514,694 | 4/1985 | Finger | 324/429 |
| 4,558,281 | 12/1985 | Codd et al. | 324/427 |
| 4,560,937 | 12/1985 | Finger | 340/636 X |
| 4,595,880 | 6/1986 | Patil | 364/483 X |
| 4,665,370 | 5/1987 | Holland | 340/636 X |
| 4,678,998 | 7/1987 | Muramatsu | 340/636 X |
| 4,707,795 | 11/1987 | Alder et al. | 324/433 X |
| 4,719,427 | 1/1988 | Morishita et al. | 324/431 X |
| 4,743,855 | 5/1988 | Randin et al. | 324/427 X |

Primary Examiner—Parshotam S. Lall
Assistant Examiner—Joseph L. Dixon
Attorney, Agent, or Firm—Antonelli, Terry & Wands

[57] ABSTRACT

A novel automotive battery life diagnosis apparatus is disclosed, in which the terminal voltage, charge-discharge current and the temperature of a battery are detected, output signals from the detectors are applied to and processed in a predetermined manner by a control unit, and a life alarm is displayed on a display unit. Further, the control unit has the functions to calculate a value representing the life of the battery from the detection signals of the detectors before and after cranking of an internal combustion engine and to store an initial value of a parameter representing the battery life in the initial stage of battery operation. The initial value of the parameter is compared with the present value thereof to forecast and indicate the life of the battery on the display unit from a predetermined relationship formed by life curves between the initial value and the present value of the parameter.

4 Claims, 4 Drawing Sheets

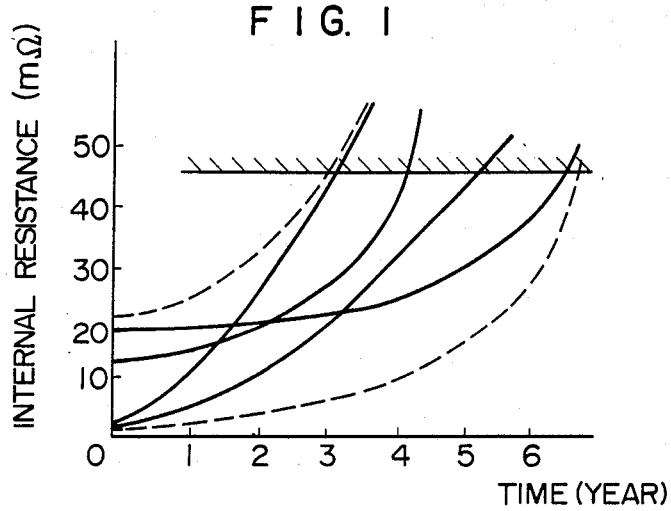
F I G. 1
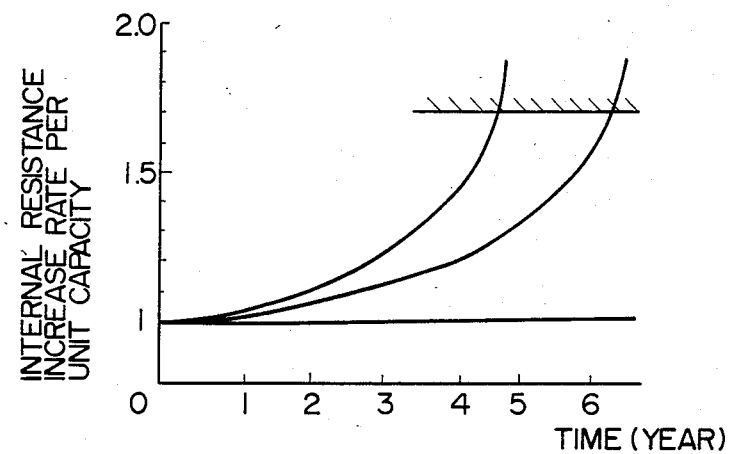
F I G. 2

F I G. 3
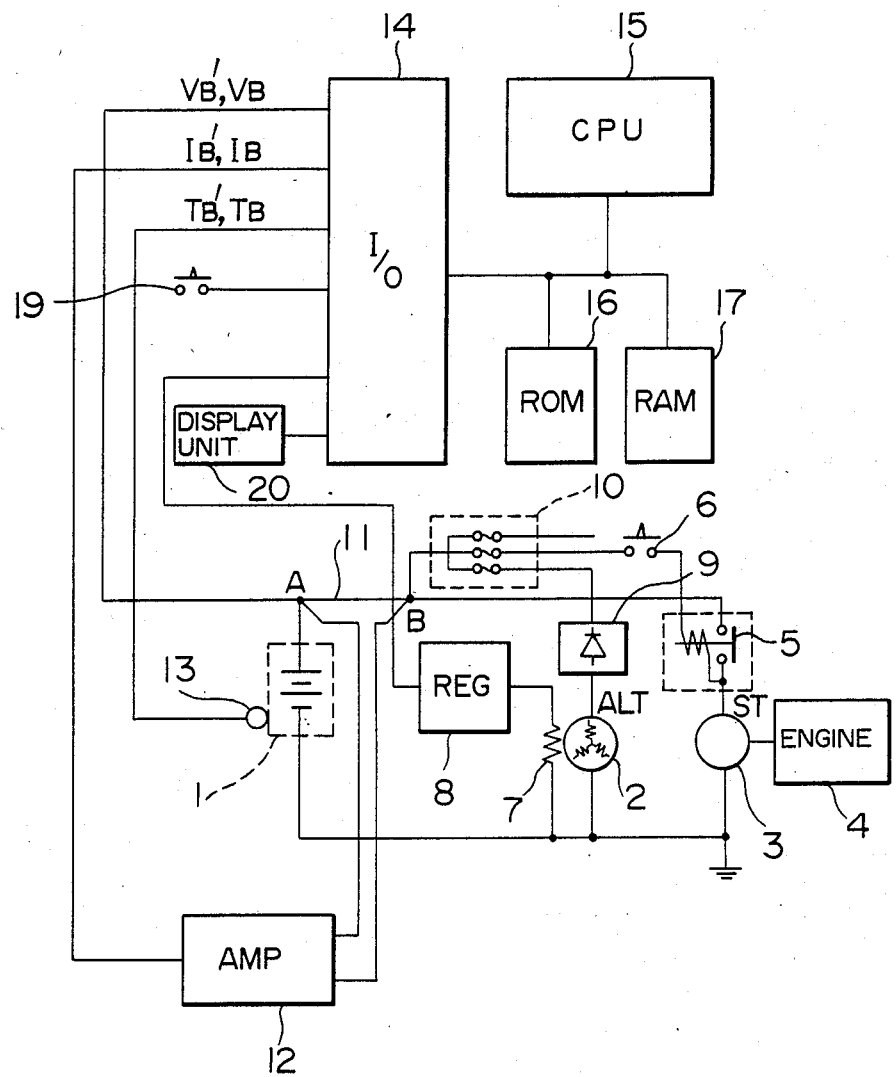

F I G. 4
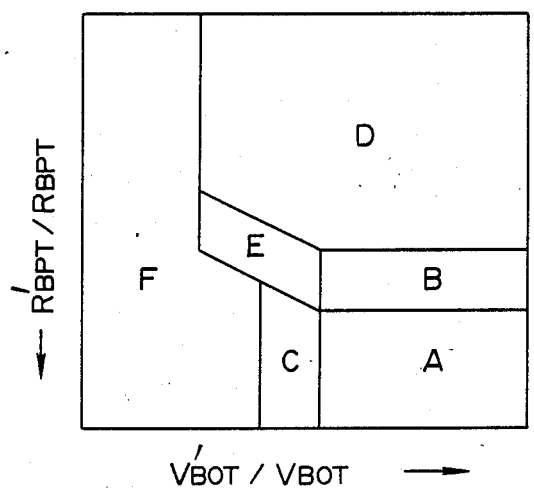

LIFE DIAGNOSIS APPARATUS FOR AUTOMOTIVE BATTERY

BACKGROUND OF THE INVENTION

1. Field of the Invention

The present invention relates to a life diagnosis apparatus for determining and indicating the service life of an automotive battery, or more in particular to a life diagnosis apparatus for automotive battery capable of diagnosing the charged condition and the service life of an automotive battery with improved accuracy.

2. Description of the Prior Art

In conventional life diagnosis apparatuses for automotive battery as disclosed in JP-A-No. 53-79238, JP-A-No. 53-127646 and JP-A-No. 56-126774 specifications, the terminal voltage, charge-discharge current and the temperature of a battery for automobiles (hereinafter referred to as a "battery") are detected, and the detection values are processed by a computer to determine output values related to the charged condition and the service life of the battery including the amount of balance charge, starting amount of charge, internal resistance and the shorting current, thereby judging and diagnosing the service life and the charged condition by comparing these output values with a predetermined reference level.

These prior art apparatuses, however, do not have any means for offsetting the initial variations of the batteries, which are added, together with the error in correcting the changes in the detection conditions, to the secular variations. As a result, if an attempt is made to make simple judgement and diagnosis with a threshold value, the resulting error often causes normal products to be confused with troubled products.

Further, in the prior art described above, it is rare to detect, process, indicate and control the internal resistance and the leak current clearly, which represent the residual amount of available charges and the degeneration of the battery. As a consequence, a battery not charged in full is often disposed of as a degenerated product, or a battery whose life has expired is charged in full for use under the low-temperature environment of a cold area often resulting in a starting trouble.

SUMMARY OF THE INVENTION

The present invention has been developed in view of the various shortcomings of the prior art described above.

The primary object of the present invention is to provide a battery life diagnosis apparatus in which initial variations are offset to diagnose the charged condition and service life of a battery with an improved accuracy.

Another object of the present invention is to provide a battery life diagnosis apparatus in which a battery relief area is widened to relieve samples still serviceable by improving the diagnosis accuracy.

According to the present invention, in order to achieve the aforementioned objects, there is provided a battery life diagnosis apparatus comprising means for detecting the terminal voltage, charge-discharge current and the temperature of a battery, control means for performing a predetermined processing operation based on an output signal applied thereto from the detection means, and means for indicating a life alarm, the control means including the function of calculating a value representing the battery service life based on a detection signal from the detection means before and after the cranking of the engine, the function of storing the initial value of a parameter representing the battery service life in the initial stage of battery operation, and the function of comparing the initial value of the parameter with the present value thereof to forecast the service life of the battery from a predetermined relationship of a life curve between the initial and present values of the parameter and to produce a forecast signal for alarming and indication.

In this configuration, the initial values specific to individual batteries being used (that is, changes in internal resistivity per unit capacity) are compared for judgement, so that only secular variations are definitely determined, thus making it possible to determine the battery life properly and accurately in accordance with the initial condition thereof.

BRIEF DESCRIPTION OF THE DRAWINGS

The foregoing objects and other objects as well as the characteristic features of the present invention will become more apparent and more readily understandable by the following description and the appended claims when read in conjunction with the accompanying drawings, in which:

FIG. 1 is a diagram showing secular variations of an internal resistor providing a basis for life diagnosis of an automotive battery according to the present invention;

FIG. 2 is a diagram showing secular variations of the rate of increase in the internal resistance per unit capacity providing a basis for life diagnosis of an automotive battery according to the present invention;

FIG. 3 is a general view of a life diagnosis apparatus for an automotive battery according to an embodiment of the present invention;

FIG. 4 shows judgement ranks and ranges corresponding to the contents of Table 1 described in the specification.

DESCRIPTION OF THE PREFERRED EMBODIMENTS

Figure 5:
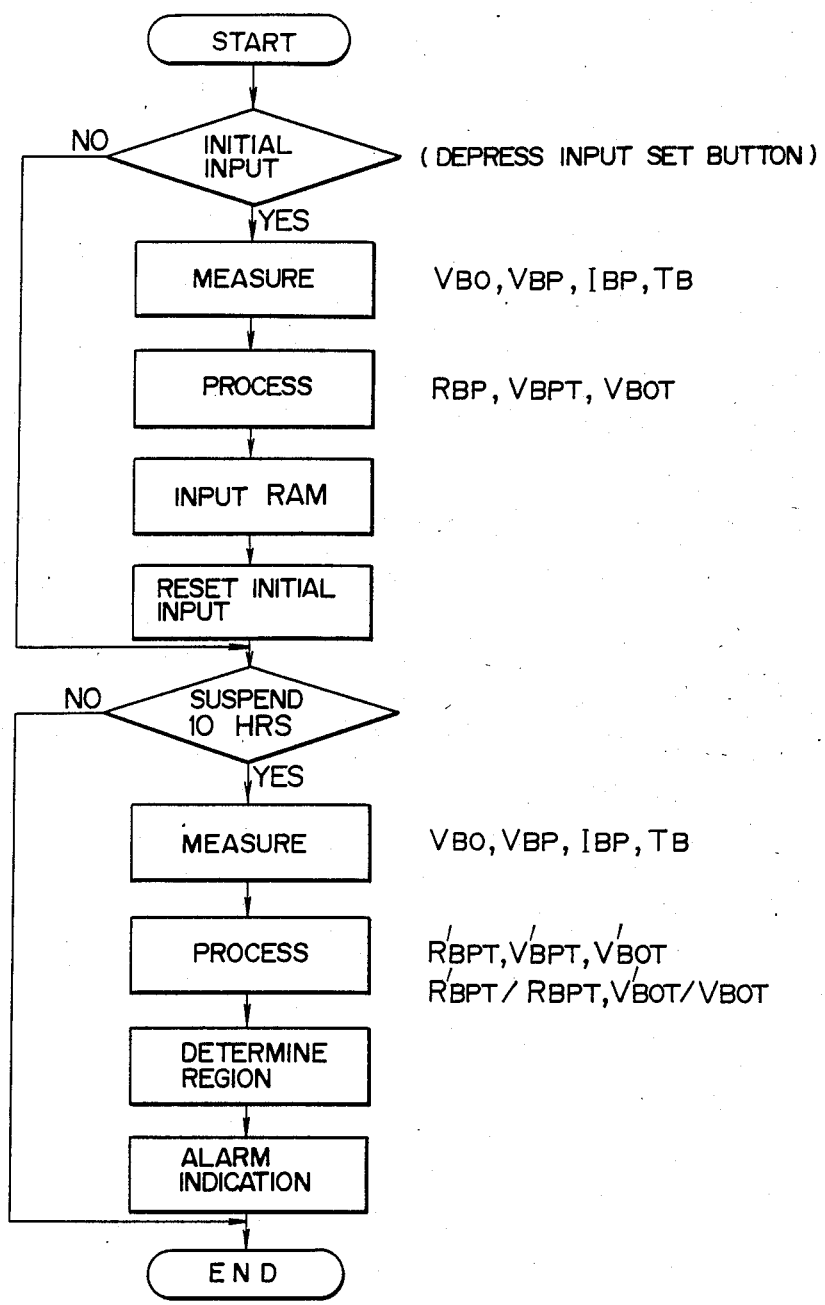
FIG. 5 is an example of flowchart for embodying the present invention.

Before detailed description of embodiment of the present invention, explanation will be made of the principle of battery life diagnosis providing a basis of the features of the present invention and an internal resistance of a battery as a parameter closely correlated with the life diagnosis.

The internal resistance of batteries of different nominal capacities in use are plotted in FIG. 1 together with secular variations and measuring conditions. Specifically, the internal resistance of a battery generally depends on the adsorption-dissociation ability of ions at the interface between an electrode and electrolyte. This resistance tends to increase with the decrease in the effective electrode area due to degeneration or separation of the active electrode materials. It may be said to undergo a constant change from a macroscopic point of view. This change, which is caused by the electrochemical reaction, is dependent on temperature (that is, the internal resistance decreases with the rise in temperature) on one hand, and is affected by variations in initial stages of the battery on the other hand. It is very difficult to control them collectively.

In FIG. 1 showing solid lines representing the internal resistance characteristics of four selected ones of various batteries of different nominal capacities, the general characteristic trend is such that, as shown by two dashed lines in the drawing, the internal resistance of the batteries steadily increases with time as explained above. The dashed lines in FIG. 1 show outermost curves defining the whole internal resistance of a plurality of batteries of different nominal capacities provided for characteristic measurement (ratio between voltage and current as of five seconds following discharge start) with secular variations, that is, the distance covered plotted along the abscissa.

The internal resistance of the batteries with this trend is divided first by the nominal capacity and then by the initial value of a particular battery for all the batteries to standardize the secular variations as shown in FIG. 2. This is considered as a secular variation of the increase rate of the internal resistance per unit battery capacity. A statistical study by the inventors of the internal resistance and the increase rate of resistance per unit capacity of batteries with short life shows that it is possible to make a more accurate diagnosis not alone by referring to the internal resistance but by determining the life from the change in resistance increase rate.

The present invention is based on the abovementioned confirmation and verification by the inventors.

To further improve the accuracy of battery life diagnosis based on the changes in internal resistance per unit battery capacity, it is necessary to compensate for the temperature dependency of the battery. For this purpose, a compensation factor is determined experimentally. This is by reason of the fact that the temperature dependency of a battery on the car should preferably be determined by taking into consideration the temperature dependency of the starter and the engine which are loads of the battery at the time of engine cranking, and it is meaningless to determine a compensation factor from the temperature dependency of the battery alone.

FIG. 3 is a general view of a life diagnosis apparatus for an automotive battery according to an embodiment of the present invention.

In FIG. 3, a battery 1 is connected electrically in parallel to an alternator 2 and a starter 3. The starter 3 is connected mechanically through a gearing to an engine. An electromagnetic switch 5 is operated by an engine switch 6. The output voltage of the alternator 2 is regulated by an excitation coil 7. Electrical energy is supplied by the battery as required to various loads after A/D conversion in a rectifier 9 through a fuse box 10.

Numeral 8 designates a regulator for controlling the amount of charges to the battery 1 by detecting the charged condition thereof. A wire harness 11 connected to the battery 1 is constructed of bundles of wires. The ends A and B of the wire harness 11 are connected with an amplifier 12 for detecting a current from the voltage drop due to a charge-discharge current. A current signal $I_B$ from the amplifier 12, a battery terminal voltage signal $V_B$, and a temperature signal $T_B$ from a temperature sensor 13 for detecting a representative average temperature of the electrolyte and electrodes of the battery are applied to an input/output (I/O) unit 14. Further, the I/O unit 14 is connected with a central processing unit (CPU) 15, a read-only memory (ROM) 16 and a random-access memory (RAM). The I/O unit 14 is also connected with an input set button 19.

Explanation will be made of the operation of the circuit having the above-mentioned configuration. First, in order to process the three signals $V_B$, $I_B$ and $T_B$ from the battery 1 as initial values, the initial input set button 19 of the I/O unit 14 is depressed.

Then, with a fully-charged battery mounted (as at the final process in an automobile assembly plant), the cranking is performed so that the battery terminal voltage $V_B$, charge-discharge current $I_B$ and battery temperature $T_B$ before and after cranking are sampled at 1 ms intervals and stored in the RAM 17. From the stored data, the following values are read:

(1) The terminal voltage $V_{BO}$ with dark current flowing immediately before cranking.
(2) The maximum value $I_{BP}$ of the charge-discharge current during cranking, and the terminal voltage $V_{BP}$ associated therewith.
(3) The temperature $T_{BO}$ of the battery casing immediately before cranking.

The internal resistance $R_{BP}$ for the maximum discharged current $I_{BP}$ is determined from equation (1) below.

$$R_{BP} = \frac{V_{BO} - V_{BP}}{I_{BP}} \quad (1)$$

Further, by use of the temperature coefficient $\alpha R$ of the internal resistance $R_{BP}$ determined experimentally in advance, the temperature compensation of the internal resistance $R_{BP}$ is effected by equation (2) below.

$$R_{BPT} = R_{BP} \times \alpha R(T_{BO} - T_B) \quad (2)$$

where $T_{BO}$ indicates the atmospheric temperature of 20° C. at which the engine remains stationary, and $\alpha R$ is determined with reference to 20° C. in advance.

In this case, the relationship holds that $$R_{BPT} = 0.4 \, R_{BP} \quad (3)$$

Then, by use of the temperature coefficient $\alpha V$ of the terminal voltage determined experimentally, the temperature compensation of the voltage $V_{BO}$ is made by equation (4) below based on, say, 20° C.

$$V_{BOT} = V_{BO} \times \alpha v(T_{BO} - T_B) \quad (4)$$

The internal resistance $R_{BPT}$ and the terminal voltage $V_{BOT}$ determined by the above-mentioned procedure are stored in the initial value area of the RAM 17, and the initial input set button 19 is released.

The car delivered to the user under this condition effects the life diagnosis repeatedly by taking the sequence described below without special manual operation while being driven.

Specifically, the suspension time before cranking has passed more than ten hours as predetermined, for instance, the battery voltage $V_B'$, charge-discharge current $I_B'$ and the battery temperature $T_B'$ before and after cranking are sampled to determine the internal resistance value $R'_{BPT}$ and the terminal voltage $V'_{BOT}$ compensated in a manner to include temperature compensation in the same way as the processing at the time of initial input. These values are then stored in the RAM 17.

FIG. 4 is a diagram showing battery judgement ranks and the ranges thereof.

Those values in operation are compared with the above-mentioned initial values to determine the ratios $R'_{BPT}/R_{BPT}$ and $V'_{BOT}/V_{BOT}$. These ratios are collated with a life diagnosis master table shown in FIG. 4 stored in the ROM 16 or the like in advance to make diagnosis of the battery life and the charged condition as of the time under consideration. The areas in the diagram are defined in the manner specified in Table 1 below and are shown in FIG. 4.

TABLE 1

| Rank | Description | |
|------|-------------|---|
| A | Charged well | Sufficient life |
| B | Charged well | Beware of life |
| C | Beware of charge | Sufficient life |
| D | Charged well | Life degenerated |
| E | Beware of charge | Beware of life |
| F | Charging required | |

FIG. 5 is a flowchart showing the diagnosis procedures.

The basic requirement of the present invention is to diagnose the service life and the charged condition of a battery on the basis of initial values. The prerequisite for this is to prepare a representative diagnosis master table based on initial values, as an operation in initial stage of input. As an alternative, instead of the calculations of the remaining life in a battery life diagnosis algorithm in initial stages, the estimated values of parameters at a life reaching point of the battery, that is, life values are entered in advance. In this case, any calculation formula for diagnosis is specified. Such a method is realiable by adding a RAM with battery back-up to the ROM.

Also, the result of diagnosis is connected to a display unit 20 through the I/O unit 14 in FIG. 3 for for displaying in graphics, characters, etc.

It will thus be understood from the foregoing description that according to the present invention, there is provided a automotive battery life diagnosis apparatus, in which the result of diagnosis, as obtained by comparing individual initial values with the values in operation, indicates the secular variations saliently, thereby remarkably improving the diagnosis accuracy as compared with the prior art apparatuses which effects simple threshold judgement from a mixture of initial variations and secular variations. Especially in the diagnosis with a combination of an internal resistance and a voltage at an open terminal, a relief area is enlarged about four times as compared with the simple threshold judgement method, thereby leading to an improved diagnosis accuracy. In addition, samples not deviated from standard in real terms are saved.

I claim:

1. In an automobile charge system comprising an alternator driven by an internal combustion engine and a battery charged by the alternator;
   an automotive battery life diagnosis apparatus comprising means for detecting the terminal voltage of the battery, means for detecting the charge-discharge current of the battery, means for detecting the temperature signal correlated with the battery, and a controller for processing as predetermined the detection inputs from the detection means;
   wherein said controller is mounted on an automobile and includes:
   first means for obtaining an initial internal resistance ($R_{BP}$) of a battery based on a battery voltage and a charge-discharge current before and after a first cranking under the fully charged condition of the battery, and fixedly memorizing at least the initial internal resistance ($R_{BP}$);
   second means for obtaining a second internal resistance ($R_{BP}$) while using the battery based on a battery voltage and a charge-discharge current before and after cranking and temporarily memorizing the second internal resistance ($R_{BP}$);
   third means for obtaining a resistance ratio of the initial internal resistance ($R_{BP}$) and the second internal resistance ($R_{BP}$) and means for comparing the resistance ratio with a battery life ratio which indicates the life state of a predetermined battery to judge the life state of the battery under test; and
   means for displaying the result on the basis of the output of the function of judging the life state of the battery.

2. An automotive battery life diagnosis apparatus according to claim 1 wherein the first means for obtaining initial internal resistance further includes means for fixedly memorizing a peak voltage ($V_{BP}$);
   said second means for obtaining a second internal resistance further includes means for temporarily memorizing a peak voltage ($V_{BP}$); and
   said third means for obtaining a resistance ratio also includes means for obtaining a voltage ratio of both peak voltages and comparing the resistance ratio and the voltage ratio with a life ratio matrix on an axis of a plot of the resistance ratio-voltage ratio which indicates the life state of the predetermined battery to judge the life state of the battery.

3. An automotive battery life diagnosis apparatus according to claim 1, wherein the life state of the battery is displayed in a selected one of graphics and characters in a format on the display unit.

4. An automotive battery life diagnosis apparatus according to claim 1, wherein the life state of the battery is classified as follows:
   Rank A: Well charged, Sufficient life
   Rank B: Well charged, Beware of life
   Rank C: Beware of charging, Sufficient life
   Rank D: Well charged, Life degenerated
   Rank E: Beware of charging, Beware of life
   Rank F: Charging required.

* * * * *